(12) United States Patent
Song

(10) Patent No.: US 6,633,248 B2
(45) Date of Patent: *Oct. 14, 2003

(54) CONVERTING DIGITAL SIGNALS TO ANALOG SIGNALS

(75) Inventor: Hongjiang Song, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/226,945

(22) Filed: Aug. 23, 2002

(65) Prior Publication Data

US 2003/0001766 A1 Jan. 2, 2003

Related U.S. Application Data

(63) Continuation-in-part of application No. 09/867,155, filed on May 29, 2001, now Pat. No. 6,469,646.

(51) Int. Cl.[7] ................................................. H03M 1/66
(52) U.S. Cl. ........................ 341/144; 341/145; 341/154
(58) Field of Search .................................. 341/144, 145, 341/154, 136, 118

(56) References Cited

U.S. PATENT DOCUMENTS

| | | | | |
|---|---|---|---|---|
| 4,083,043 A | * | 4/1978 | Breuer | 340/347 |
| 4,843,394 A | * | 6/1989 | Linz et al. | 341/154 |
| 4,947,172 A | * | 8/1990 | Suzuki | 341/145 |
| 5,075,677 A | * | 12/1991 | Meaney et al. | 341/136 |
| 5,703,586 A | * | 12/1997 | Tucholski | 341/144 |

\* cited by examiner

*Primary Examiner*—Brian Young
*Assistant Examiner*—John Nguyen
(74) *Attorney, Agent, or Firm*—Trop, Pruner & Hu, P.C.

(57) ABSTRACT

A way of converting digital signals to analog signals is provided for wireless communications. An apparatus is provided that comprises a resistive-ladder array to convert a first portion of a digital input signal to a first analog output signal. The apparatus further includes a current-mode array to convert a second portion of the digital input signal to a second analog output signal.

20 Claims, 8 Drawing Sheets

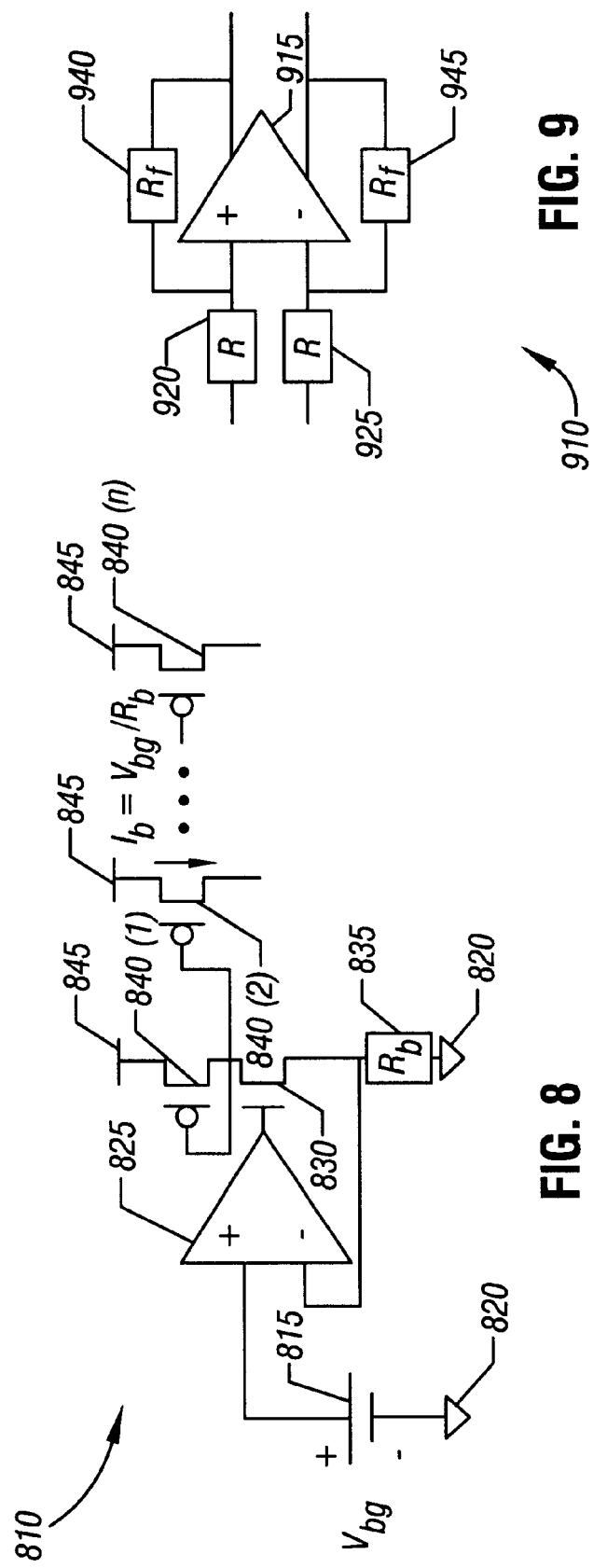

CONVERTING DIGITAL SIGNALS TO ANALOG SIGNALS

This application is a continuation-in-part of application Ser. No. 09/867,155 filed May 29, 2001, U.S. Pat. No. 6,469,646.

BACKGROUND

This invention relates generally to converting digital signals to analog signals.

Digital-to-analog (D/A) converters may be utilized to convert digital data to an analog equivalent. D/A converters may be employed in various types of devices, such as computers, measuring instruments, communication equipment, and other processor-based devices.

Traditionally, matching performance of a certain type of circuit components employed in D/A converters has been the focus in improving the operational characteristics of such D/A converters. For example, good transistor matching may be desirable when designing current-mode D/A converters, good resistor matching may be desirable when designing R-2R D/A converters, and good capacitor matching may be desirable when designing switched capacitor D/A converters. The above-mentioned methods of improving D/A converters are generally effective in an environment involving well-defined process technology, but may not be so in an environment involving several uncertainties, such as when the architecture and circuit parameters of a device employing such a D/A converter are fluid and thus prone to changes. A slight change in the device's architecture, for example, may, in some instances, call for a re-design of the D/A converter that is employed by the device, thereby introducing possible delays in the production cycle of the device.

Thus, there is a need for a flexible way of converting digital signals to analog signals that may be employed in different architectures.

BRIEF DESCRIPTION OF THE DRAWINGS

The invention may be understood by reference to the following description taken in conjunction with the accompanying drawings, in which like reference numerals identify like elements, and in which:

FIG. 8 is one embodiment of a schematic diagram of a current reference generator that may be implemented in the digital-to-analog converter of FIG. 2;

FIG. 9 is one embodiment of a schematic diagram of an output buffer that may be implemented in the system of FIG. 1;

DETAILED DESCRIPTION

Figure 1:
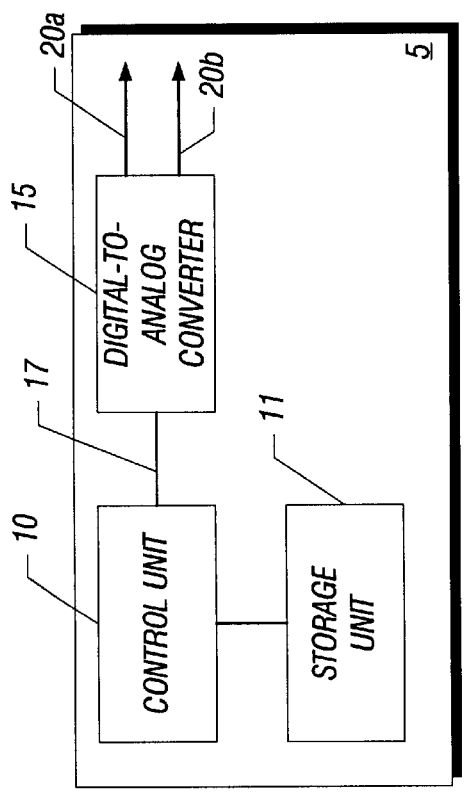
FIG. 1 is a stylized block diagram of a system employing a digital-to-analog converter, in accordance with one embodiment of the present invention.

Referring now to FIG. 1, a block diagram of a system 5 is illustrated, in accordance with one embodiment of the present invention. The system 5, in one embodiment, may be a telephone, such as a wireless telephone, a personal digital assistant, a processor-based system, or any other device in which converting digital signals to analog signals may be desirable.

The system, in one embodiment, includes a control unit 10 coupled to a storage unit 11. The storage unit 11, in one embodiment, may be one of a variety of forms of memory. The control unit 10, in one embodiment, may be communicatively coupled to a digital-to-analog converter (DAC) 15, in one embodiment over a line 17. In an alternative embodiment, the system 5 may include a modulator (not shown) or other elements between the control unit 10 and DAC 15, depending on the implementation. The output of the DAC 15 may be provided over lines 20a and 20b, wherein, in one embodiment, the two lines 20a, 20b carry signals that are complementary. In one embodiment, the DAC 15 may have a fully-differential structure. The DAC 15, the storage unit 11, and/or the control unit 10, which, for example, may be a digital signal processor that may be integrated in a single chip, in one embodiment.

Figure 2:
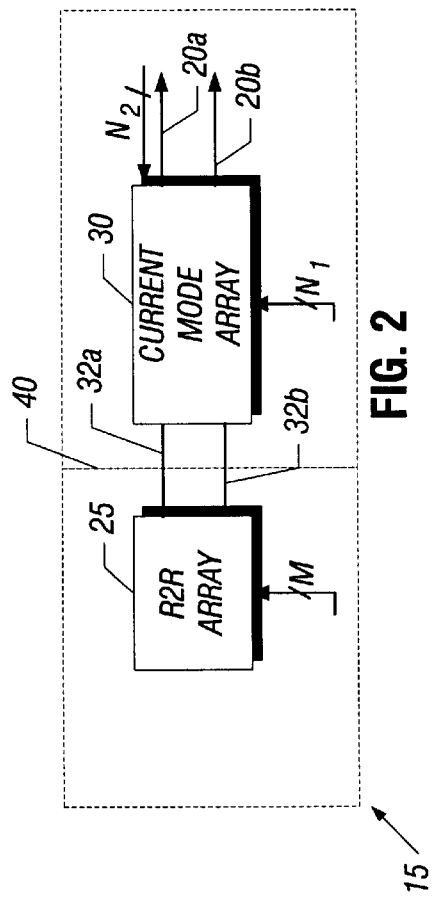
FIG. 2 is a block diagram of the digital-to-analog converter of FIG. 1 employing an R-2R array and a current-mode array, in accordance with one embodiment of the present invention.

Referring now to FIG. 2, a block diagram of the DAC (or the DAC architecture) 15 that may be employed in the system 5 of FIG. 1 is illustrated, in accordance with one embodiment of the present invention. In one embodiment, the DAC 15 includes a R-2R array 25 communicatively coupled to current-mode array 30 by lines 32a and 32b. In accordance with one embodiment of the present invention, the architecture of the DAC 15 includes a re-configurable partitioning 40 between the R-2R and current-mode arrays 25, 30. In the illustrated DAC architecture, in one embodiment, the most significant bits (MSBs) of an input digital signal may be realized using the current-mode array 30, and the least significant bits (LSBs) may be realized using the R-2R array 25. Although the DAC 15 is illustrated having an R-2R array 25, in an alternative embodiment other resistive-array configurations may be employed.

In one embodiment, the architecture of the DAC 15 may be able to take advantage of both the current-mode and R-2R DAC architectures. The R-2R DAC 25, for example, may be used to realize M LSBs, while the current-mode DAC 30 may be utilized to realize N MSBs. The R-2R DACs tend to be relatively smaller and less accurate than, for example, current-mode DACs, which may be larger but more accurate than the R-2R DACs. Thus, in one embodiment, a desirable comprise between accuracy and size may be achieved such that the LSBs may be realized using the R-2R DAC 25 and the MSBs using the current-mode DAC 30. In one embodiment, the architecture of the DAC 15 may result in improved differential nonlinearity (DNL) and integral nonlinearity (INL), reduced layout area, and less power consumption.

Figure 3:
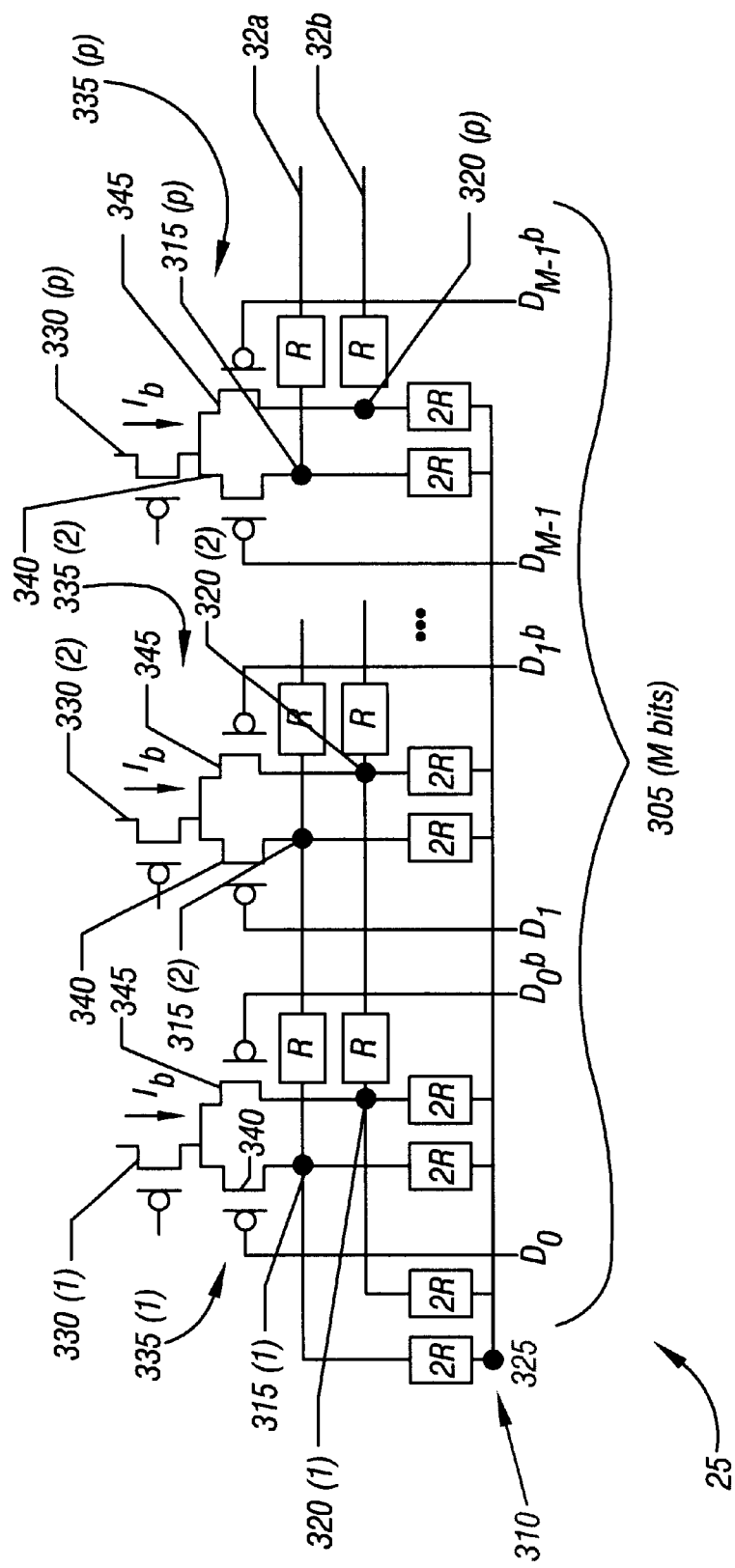
FIG. 3 is one embodiment of a schematic diagram of the R-2R array of the digital-to-analog converter of FIG. 2.

Referring now to FIG. 3, one embodiment of a structure of the R-2R array 25 of FIG. 2 is illustrated. In one embodiment, the R-2R array 25 is a one-dimensional R-2R array. The R-2R array 25, in one embodiment, is capable of receiving a M-bit digital input signal 305 and converting it to an analog signal. Accordingly, the R-2R array 25, in one embodiment, includes a M-bit R-2R ladder 310 comprising one or more series arms and shunt arms to provide an analog output signal on the lines 32a, 32b. In one embodiment, each series resistance R is disposed between each successive pair of nodes 315(1), 315(2); 315(2), 315(3), and so forth of the R-2R ladder 310. Similarly, another series resistance R, in one embodiment, is displayed between each successive pair of nodes 320(1), 320(2); 320(2), 320(3), and so forth of the R-2R ladder 310. In one embodiment, as shown, each shunt resistance 2R is connected between nodes 315(1-p) and a node 325 or nodes 320(1-p) and the node 325.

The R-2R array 310, in one embodiment, includes a drain terminal of one or more transistors 330(1-p) coupled to one or more switches 335(1-p). A reference or bias current, $I_b$, may be provided to each of the switches 335(1-p) through the respective transistors 330(1-p). Although not so limited, in the illustrated embodiment, each switch 335(1-p) comprises two transistors 340, 345, where a source terminal of the transistors 340, 345 is coupled to each other. A gate terminal of each transistor 340, 345 of the switches 335(1-p) is adapted to receive a respective input bit, D, and a complimentary input bit, $D_b$. Thus, in one embodiment, the input bits (i.e., D and $D_b$) control the switches 335(1-p).

In one embodiment, input bit, $D_0$, may represent the MSB of the digital input signal provided to the R-2R array 25, and the input bit, $D_{M-1}$, may represent the LSB of the M-bit digital input signal. In one embodiment, the principle of operation of the R-2R array 25 includes the current flowing in the resistive network in a simple progression of powers of 2. Thus, with a rightward progression along the ladder, in one embodiment, the currents that flow in the shunt branches are respectively one half, one quarter (and so on) of the current entering the resistive ladder 310. The R-2R array 25, in one embodiment, is iterative, such that the equivalent resistance presented by the resistive ladder 310 to any node 315 is R. The R-2R array 25 thus, in one embodiment, receives M-bits of the input digital signal 305 and generates an analog output signal on the lines 32a and 32b.

Figure 4:
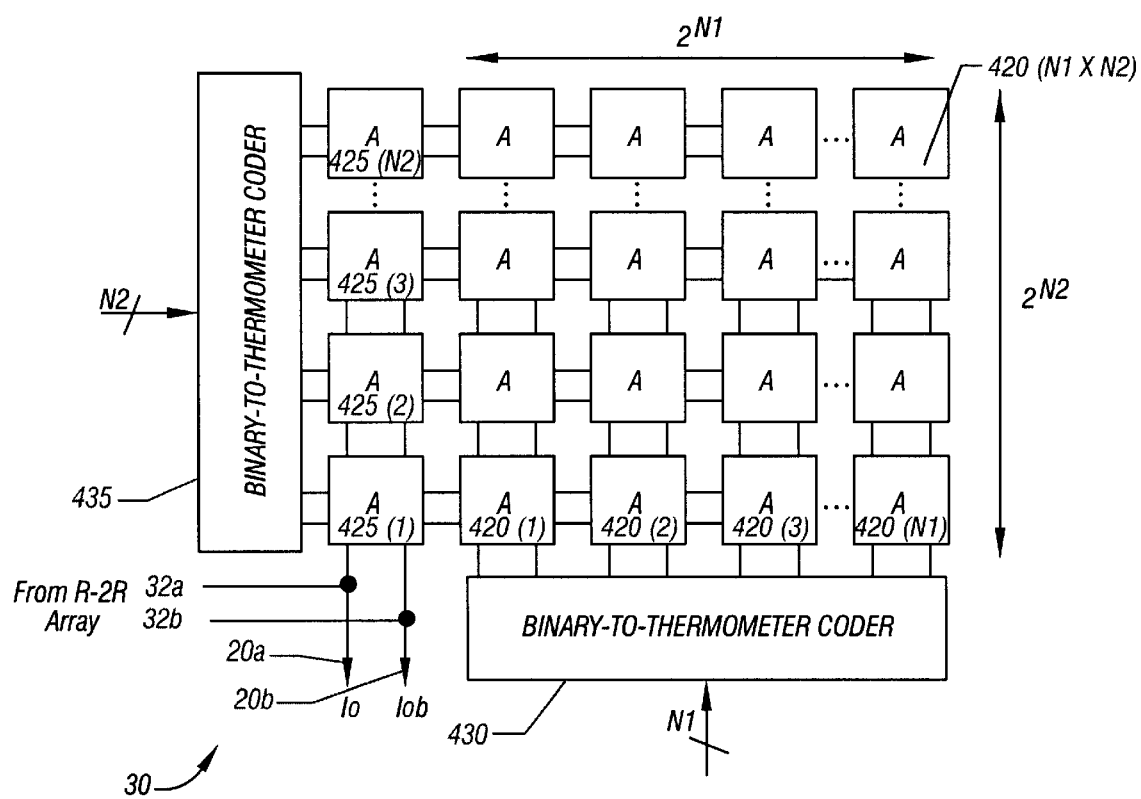
FIG. 4 is one embodiment of the current-mode array of the digital-to-analog converter of FIG. 2.

Referring now to FIG. 4, one embodiment of a schematic diagram of a structure of the current-mode array 30 of FIG. 2 is illustrated. The current-mode array 30, in one embodiment, is capable of converting N MSBs of the input digital signal to an analog output signal. The current-mode array 30, in one embodiment, includes a N1×N2 current array, which may comprise a plurality of column current cells (e.g., cells "A") 420(1-N1×N2) and a plurality of row current (e.g., cells "B") cells 425(1-N2).

The column cells 420(1-N1×N2) are adapted to receive decoded signals from a column binary-to-thermometer 430 and the row cells 425(1-N2) are adapted to receive decoded signals from a row binary-to-thermometer coder 435. The column binary-to-thermometer coder 430, in one embodiment, receives N1 bits of the MSBs of the input digital signal and generates a plurality of decoded signals that may be provided to the columns cells 420(1-N1×N2). The row binary-to-thermometer coder 435 receives, in one embodiment, N2 bits of the MSBs of the input digital signal and generates a plurality of decoded signals that may be applied to the row cells 425(1-N2).

In the illustrated embodiment, for a giving digital code, a selected number of rows and columns of the current-mode array 30 are turned ON. As the input digital code is incremented, in one embodiment, the current cells 425(1-N2) in the next row may be turned on sequentially. Thus, in one embodiment, the output of the current-mode array 30 may be a current weighted output, where the total current may depend on the number of currents cells 420(1-N1×N2) and 425(N2) are activated. The output of the current-mode array 30 may be provided on the lines 20a and 20b (see also FIG. 2). In one embodiment, the analog output signal from the R-2R array 25 (see FIG. 2) and the analog signal from the current-mode array 30 is provided on the lines 20a and 20b.

Figure 5:
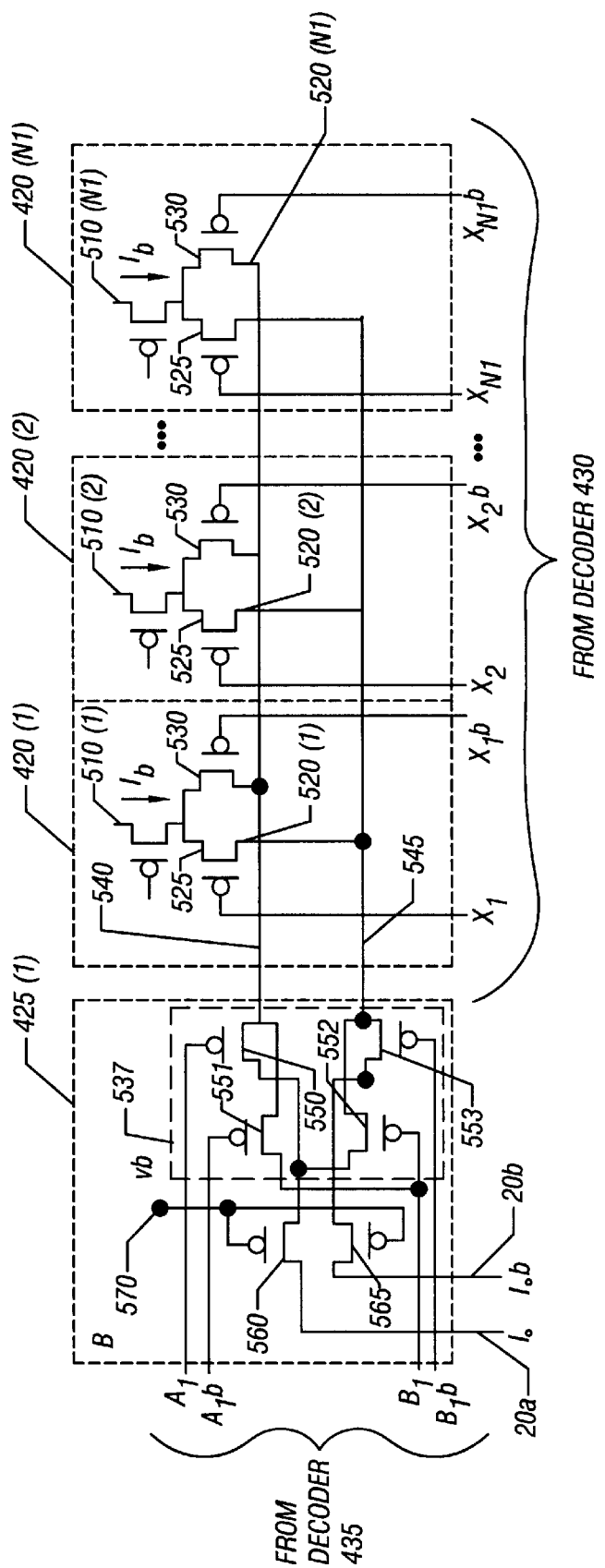
FIG. 5 is one embodiment of a schematic diagram of a switched current array cell structure that may be employed in the current-mode array of FIG. 4.

Referring now to FIG. 5, one embodiment of a schematic diagram of a switched current array cell structure 510 that may be implemented in the current-mode array 30 of FIG. 4 is illustrated. FIG. 5 illustrates a first row of current cells 420(1-N1) and 425(1) of the current-mode array 30. Each column cell 420(1-N1) of the first row includes a connection at transistors 510(1-N1), in one embodiment. The connection of transistors 510(1-N1), in one embodiment, effectively mirror a bias current, $I_b$, which is provided to a plurality of column switches 520(1-N1).

Each of the column switches 520(1-N1), in one embodiment, receives a decoded signal and a complementary decoded signal from the binary-to-thermometer coder 430. Although not so limited, the switches 520(1-N1) in the illustrated embodiment includes a pair of transistors 525, 530. In the illustrated embodiment, the source terminals of the transistors are coupled to each other. A drain terminal of each of the transistors 510(1-N1) is coupled to the source terminals of each of the respective transistors 525, 530. A drain terminal of each transistor 525 of the column switches 520(1-N1) receive a decoded signal from the coder 430, and a drain terminal of each transistor of the column switches 520(1-N1) receive a complement of the decoded signal from the coder 430, in one embodiment.

A drain terminal of the transistor 525 of each of the switches 520(1-N1) is coupled to a row switch 537 of the row cell 425(1) over a line 540, in one embodiment. A drain terminal of the transistor 530 of each of the switches 520(1-N1) is coupled to the row switch 537 of the row cell 425(1) over a line 545.

The row switch 537 of the row cell 425, in one embodiment, receives decoded signals from the row decoder 435. Although not so limited, in the illustrated embodiment the row switch 537 includes four transistors 550–553. A gate terminal of the transistors 550, 551 of the switch 537 receives a decoded signal, $A_1$, and a complementary decoded signal, $A_{1b}$, respectively, from the row decoder 435, in one embodiment. A gate terminal of the transistors 552, 553 of the switch 537 receives a decoded signal, $B_1$, and a complementary decoded signal, $B_{1b}$, respectively, from the row decoder 435, in one embodiment. In the illustrated embodiment, the decoded signal, $A_1$, represents the current bit (nth bit) decoder output while the decoded signal, B, represents the next bit ((n+1)th bit) of the decoder output.

In one embodiment, a drain terminal of the transistor 550 is coupled to a source terminal of the transistor 551 of the row switch 537. A drain terminal of the transistor 551, in one embodiment, is adapted to receive the decoded signal, $B_1$, from the row decoder 435. A source terminal of the transistor 553 is coupled to a source terminal of the transistor 552, in one embodiment.

The row cell 425(1), in one embodiment, includes a pair of transistors 560, 565 substantially at the output of the row cell 425(1). In the illustrated embodiment, a gate terminal of both the first transistor 560 and the second transistor 565 is coupled to a voltage ($V_b$) node 570. Thus, in one embodiment, the transistors are ON when the voltage at node 570 is low, and are OFF when the voltage is high.

A source terminal of the first transistor 560, in one embodiment, is coupled to drain terminals of the transistors 550, 552 of the row switch 537 of the row cell 425(1). A source terminal of the second transistor 565, in one embodiment, is coupled to a drain terminal of the transistor 553 of the row switch 537.

The transistors 560, 566, in one embodiment, may reduce the switching noise by isolating charge spikes. This may be accomplished, in part, because the signal provided to the source and drain terminals of the switch transistors 550, 551, 552, and 553 is passed through the channel resistor of the transistors 560 and 565 substantially at the output terminals of the row cells 425(1-N2), thereby reducing the switching noise.

Figure 6:
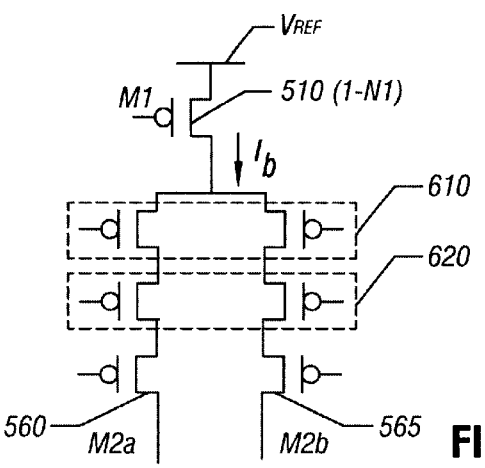
FIG. 6 is one embodiment of a current switching scheme that may be utilized in the current-mode array of FIG. 4.

Referring now to FIG. 6, one embodiment of a switching scheme that may be utilized to realize the current-mode array 30 of FIG. 4 is illustrated. The switching scheme, in one embodiment, includes a column switch 610 and a row switch 620 located between transistors 510(1-N1) and transistors 560 and 565. The row switch 610 and column switch 620 may be representative of the row and column switches of each current cell of the current-mode array 30 of FIG. 4. In one embodiment, the transistors 560 and 565 may aid in reducing the switching noise while the current-mode array 30 (see FIG. 4) is operational.

In one embodiment, the configuration of the current array cells 420(1-N1) and 425(1-N2) (see FIG. 5) may reduce the device counter that may be required to realize the two-dimensional current-mode array 30. For example, in an 8-bit array, which may call for a 256 column cells 420(1-N1) and 16 row cells 425(1-N2), by implementing the illustrated switching scheme and the cascade function in the row cell 425(1-N2) (as opposed to the column cell 420(1-N1), it may be possible to reduce the device counter required to realize the current-mode array 30.

Figure 7:
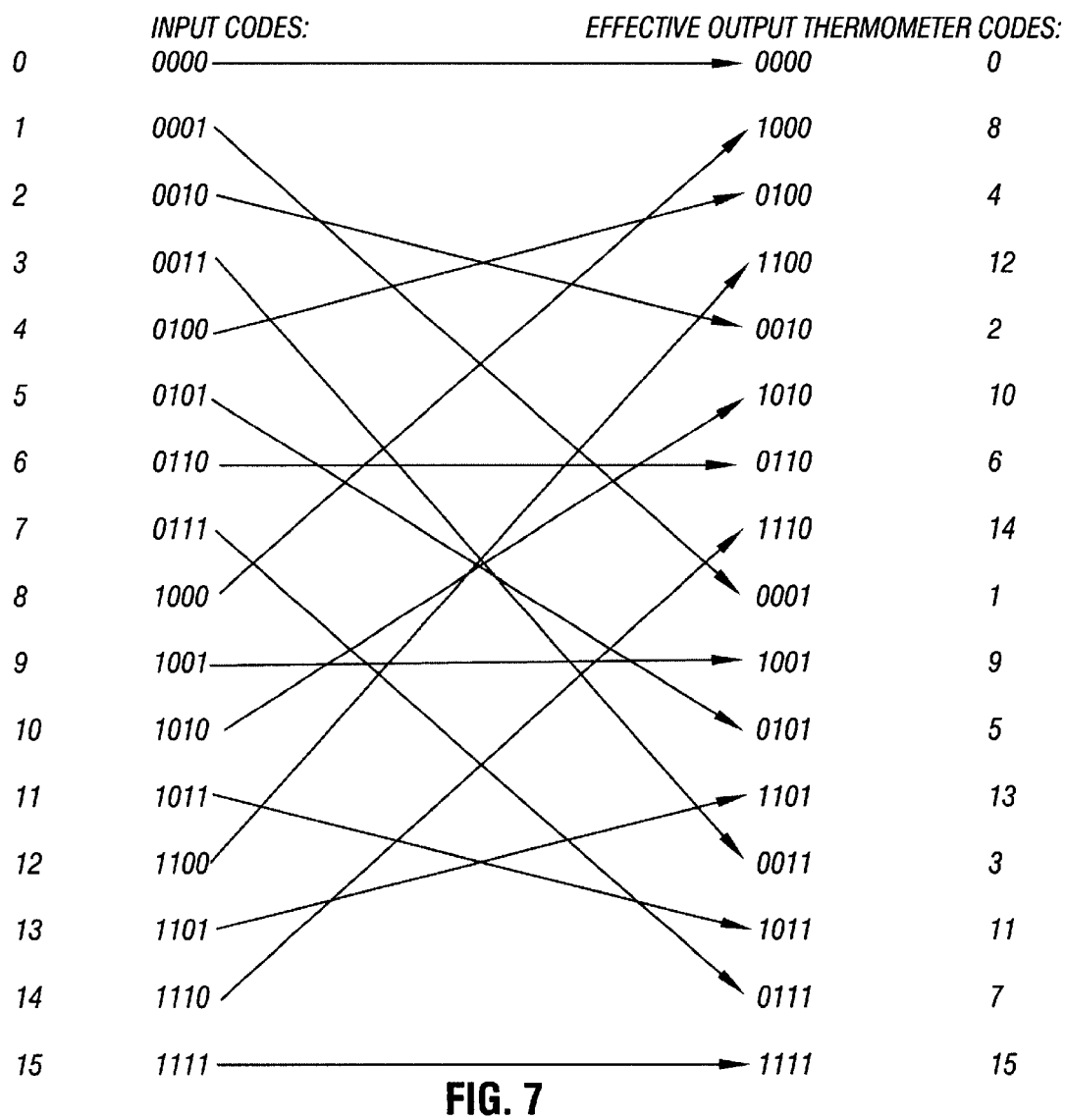
FIG. 7 is an example random coding scheme that may be employed by the current-mode cell array of FIG. 4.

Referring now to FIG. 7, a random coding scheme 710 that may be employed by the current-mode cell array 30 of FIG. 4 is illustrated. FIG. 7 illustrates an exemplary 4-bit pseudo-random coding scheme, although the illustrated scheme may be extended to converters with different resolution. The random coding scheme 710, in one embodiment, is a maximum distance coding scheme that randomizes the mismatch of the current cells 420(1-p). The random coding scheme 710 may improve the linearity of the DAC 15 (see FIG. 2).

As shown in the illustrative random coding scheme 710, an input code of "0000" may result in an output thermometer code of "0000," an input code of "0001" may result in an output thermometer code of "1000," an input code of "0010" may result in an output thermometer code of "0100," and so forth. Although not so limited, in the illustrated random coding scheme 710 the input and output bits are reversed. In alternative embodiments, other random coding schemes may be employed. The random coding scheme 710 may improve the linearity of the DAC 15 because it may provide space-domain mismatch shaping of the DAC implementation, and the mismatch effects of the device may be reduced.

Referring now to FIG. 8, one embodiment of a current reference generator 810 that may be employed to provide the bias current ($I_b$) to the R-2R cell array 25 and current-mode array 30 of the DAC 15 of FIG. 2 is illustrated. The current reference generator 810, in one embodiment, includes a voltage source 815 between a ground node 820 and a non-inverting terminal of an operational amplifier 825. An output terminal of the operational amplifier 825 may be coupled to a gate terminal of a transistor 830. A drain terminal of the transistor 830 may be coupled to an inverting terminal of the operational amplifier 825 through a feedback loop. The current reference generator 810, in one embodiment, includes a resistor 835 between the drain terminal of the transistor 830 and the ground node 820.

In one embodiment, the current reference generator 810 includes one or more transistors 840(1-n). A source terminal of the first transistor 840(1) is coupled to a reference voltage node 845 and a drain terminal of the first transistor 840(1) is coupled to a source terminal of the transistor 830, in one embodiment. In one embodiment, the bias current, $$I_b \left( e.g., \frac{V_{815}}{R_{835}} \right)$$

flows through the first transistors 840(1), where the bias current may be mirrored to the transistors 840(2-n). A gate terminal of each transistor 840(1-(n-1)) is coupled to the gate terminal of the next transistor, and a source terminal of each transistor 840(1-n) is coupled to the voltage reference node 845. The bias current, $I_b$, from the transistors (2-n), in one embodiment, may be provided to respective cells of the R-2R array 25 and current-mode array 30 of the DAC 15 (see FIG. 2).

By providing the bias current to all of the cells of the DAC 15, the linearity, gain, and/or operation range of the DAC 15 may depend primarily on the matching of the components, thereby making it possible to achieve higher accuracy across PVT corners. The operating characteristics of transistors can change under a variety of circumstances. For example, these operating characteristics change with variations in operating conditions such as junction temperature and supply voltage levels. The operating characteristics may also change with variations in manufacturing process. The particular set of process, voltage and temperature parameters or conditions is referred to as a PVT corner.

Referring now to FIG. 9, one embodiment of an output buffer 910 that may be employed by the system 5 of FIG. 1 at the output of the DAC 15 is illustrated. The output buffer 910 includes an operational amplifier 915 having first terminals of first and second resistors 920, 925, coupled to respective non-inverting and inverting terminals of the operational amplifier 915. The second terminals of the resistors 920, 925 may be adapted to receive signals from the output lines 20a, 20b (see FIG. 1) of the DAC 15. The output buffer 910, in one embodiment, includes a first feedback resistor 940 between a first output terminal and the non-inverting terminal of the operational amplifier 915. The output buffer 910, in one embodiment, includes a second feedback resistor 945 between a second output terminal and the inverting terminal of the operational amplifier 915. The output buffer 910, in one embodiment, is capable of providing the system 5 (see FIG. 1) additional load driving capability.

Figure 10B:
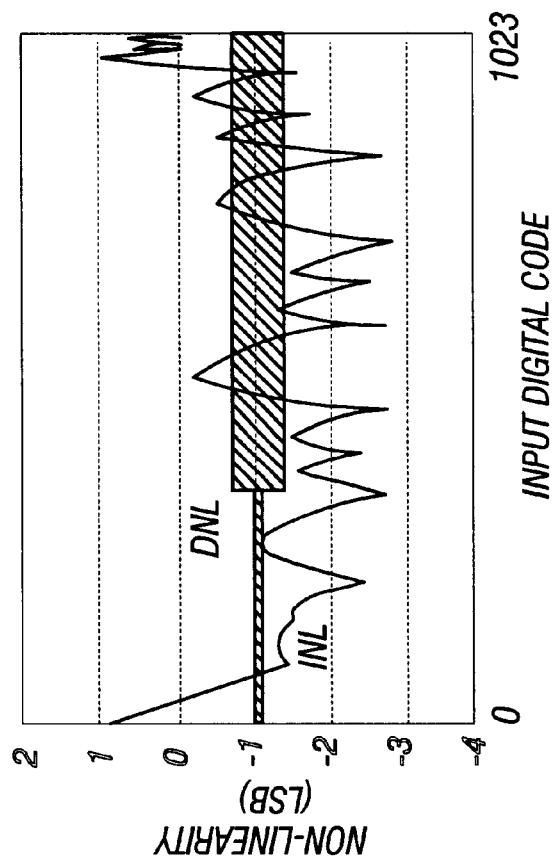
FIGS. 10A–10B illustrate an example of graphs contrasting the linearity of the current-mode array of FIG. 4.
Figure 10A:
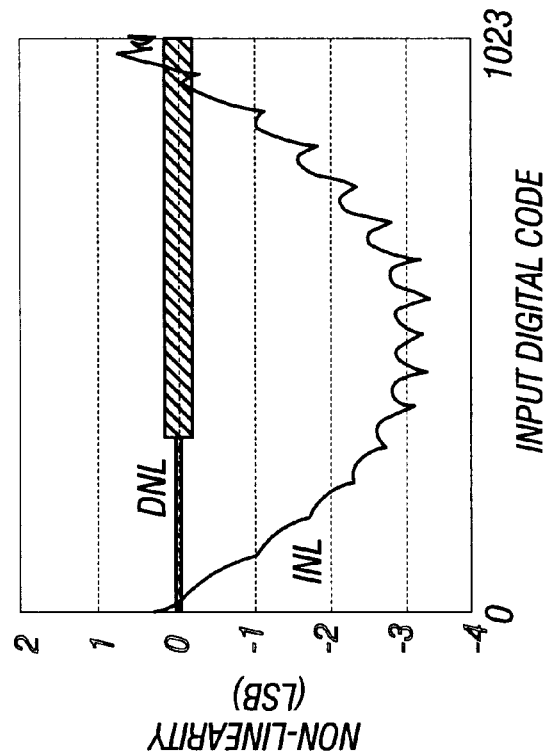

Referring now to FIGS. 10A and 10B, an example of graphs contrasting the linearity of the current-mode array 30 of FIG. 4 using a non-random and random coding is illustrated. Each graph illustrates an example of the overall INL and DNL of the DAC, where the x-axis represents the DAC input digital code and the y-axis represents the overall linearity of the DAC, measured using the LSB step as the unit.

Integral non-linearities typically result from errors produced in a conversion between analog and digital values over a wide range of values. Differential non-linearities typically result from errors produced in a conversion between analog and digital values over a relatively narrow range of such values.

Figure 11:
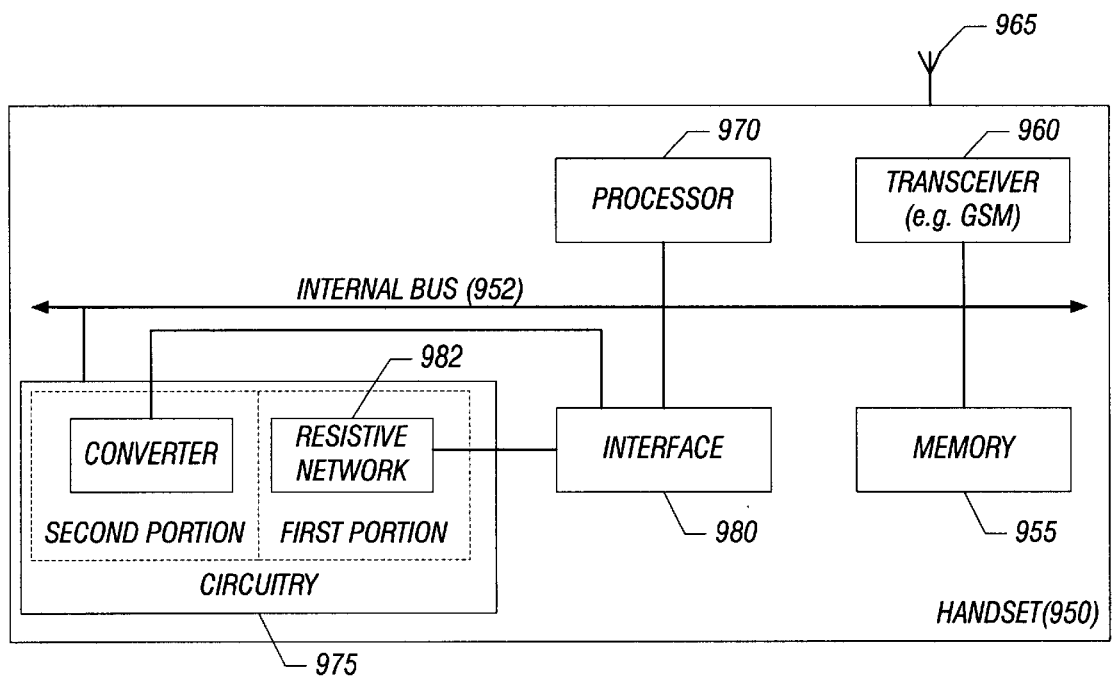
FIG. 11 shows a handset that uses the digital-to-analog converter of FIG. 1 according to one embodiment of the present invention.

Referring to FIG. 11, a handset 950, which may be a wireless communication device in one embodiment, includes an internal bus 952 that couples a memory device 955 to a wireless transceiver 960, such as a global system of mobile communications (GSM) transceiver for communicating over a wireless network including a cellular network. An antenna 965 may be coupled to the handset 950 to receive and transmit wireless communications in one embodiment. An example of the antenna 965 is a dipole antenna. Examples of the memory device 955 include a flash, a static random access memory (SRAM) and a dynamic random access memory (DRAM). Examples of the handset 950 include a cell phone, a personal digital assistant, a tablet, or any other wireless communication or wireless-enabled computing device in which converting digital signals to analog signals may be desirable.

The handset 950 may further comprise a processor 970 coupled to circuitry 975, converting digital signals received at an interface 980 into analog signals. The interface 980 may receive a digital input in which one bit is less significant than the other bit consistent with one embodiment of the present invention.

The circuitry 975 may include a first and a second circuit portion which may be operably coupled to the interface 980. While the first circuit portion of the circuitry 975 may convert the less significant bit into a first analog signal, the second circuit portion thereof may convert the other bit in one embodiment. A resitive network 982 may be located in the first circuit portion of the circuitry 975 in some embodiments of the present invention. In addition, without using the resitive network 982, the second circuit portion of the circuitry 975 may convert the other than the less significant bit into a second analog signal. Finally, the circuitry 975 may combine the first and second analog signals, providing an analog output corresponding to the digital input. In one embodiment, the circuitry 975 is the digital-to-analog converter (DAC) 15 shown in FIG. 2.

Figure 12:
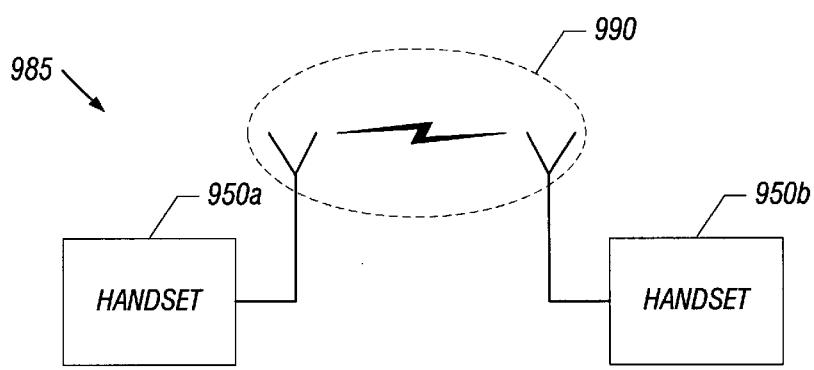
FIG. 12 is a schematic depiction of a communication system in which the handsets of FIG. 11 may communicate via a cellular network in accordance with one embodiment of the present invention.

A communication system 985, as shown in FIG. 12, includes handsets 950a and 950b for wirelessly communicating over a cellular network 990 according to one embodiment of the present invention. For example, wireless communications may be processed digitally at the handsets 950a and 950b in some cases. Using the DAC 15, each handset 950 may convert digital signals into analog signals in some embodiments of the present invention. Of course, other architectures of the communication system 985 may be deployed in other embodiments of the present invention without departing from the spirit of the present invention.

In one embodiment, one or more of the above-described architectures of the digital-to-analog converter 15 (see FIG. 2) may improve tolerance to the current mismatch. Accordingly, the linearity, in one embodiment, of the DAC 15 may be improved using the random coding scheme 710 (see FIG. 7). In one embodiment, one or more of the above-described architectures of the digital-to-analog converter 15 may provide for a wide bandwidth with slightly higher reference current, which may make the digital-to-analog converter 15 an attractive option for a wide range of applications.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method comprising:

receiving for a wireless communication, a digital input in which one bit is less significant than the other bit at circuitry including a first and a second circuit portion; and converting said less significant bit into a first analog signal with the first circuit portion of said circuitry while using the second circuit portion of said circuitry to convert the other bit into a second analog signal.

2. The method of claim 1, including using a resistive network for the first circuit portion of said circuitry to convert said less significant bit while converting the other bit signal without using the resistive network.

3. The method of claim 2, including combining said first and second analog signals to provide an analog output corresponding to the digital input from said circuitry.

4. An apparatus comprising:

an interface to receive for a wireless communication, a digital input in which one bit is less significant than the other bit; and circuitry including a first and a second circuit portion operably coupled to said interface to convert said less significant bit into a first analog signal with the first circuit portion of said circuitry while using the second circuit portion of said circuitry to convert the other bit into a second analog signal.

5. The apparatus of claim 4, further comprising:

a resistive network located in the first circuit portion of said circuitry to convert said less significant bit, wherein the second circuit portion of said circuitry to convert the other bit without using the resistive network.

6. The apparatus of claim 5, wherein said circuitry is a digital-to-analog converter that combines said first and second analog signals to provide an analog output corresponding to the digital input, and the second circuit portion of said circuitry is a current-mode array and the resistive network is a resistive-ladder.

7. The apparatus of claim 6, further comprising:

a processor operably coupled to said circuitry; and a memory device operably coupled to said processor.

8. The apparatus of claim 7, wherein said apparatus is a handset that wirelessly communicates over a wireless network.

9. The apparatus of claim 8, wherein said handset is a wireless communication device.

10. The apparatus of claim 8, wherein said handset is a wireless-enabled computing device.

11. A communication system comprising:

a handset to communicate over a cellular network;

a global system of mobile communication transceiver disposed in said handset; and a digital-to-analog converter communicatively coupled to the global system of mobile communication transceiver, the digital-to-analog converter comprising:

an interface to receive a digital input in which one bit is less significant than the other bit; and circuitry including a first and a second circuit portion operably coupled to said interface to convert said less significant bit into a first analog signal with the first circuit portion of said circuitry while using the second circuit portion of said circuitry to convert the other bit into a second analog signal.

12. The communication system of claim 11, further comprising:

an antenna communicatively coupled to the global system of mobile communication transceiver to receive and send wireless communications via the cellular network.

13. The communication system of claim 12, further comprising:

a resistive network located in the first circuit portion of said circuitry to convert said less significant bit, wherein the second circuit portion of said circuitry to convert the other bit without using the resistive network.

14. The communication system of claim 13, wherein said circuitry combines said first and second analog signals to provide an analog output corresponding to the digital input, and the second circuit portion of said circuitry is a current-mode array and the resistive network is a resistive-ladder.

15. The communication system of claim 14, wherein the second circuit portion of said circuitry is a current-mode array and the resistive network is a resistive-ladder.

16. A wireless communication device comprising:

a transceiver to communicate over a wireless network;

an interface operably coupled to said transceiver to receive a digital input in which one bit is less significant than the other bit; and circuitry including a first and a second circuit portion operably coupled to said interface to convert said less significant bit into a first analog signal with the first circuit portion of said circuitry while using the second circuit portion of said circuitry to convert the other bit into a second analog signal.

17. The wireless communication device of claim 16, further comprising:

a resistive network located in the first circuit portion of said circuitry to convert said less significant bit, wherein the second circuit portion of said circuitry to convert the other bit without using the resistive network.

18. The wireless communication device of claim 17, wherein said circuitry to combine said first and second analog signals to provide an analog output corresponding to the digital input.

19. The wireless communication device of claim 18, said circuitry is a digital-to-analog converter.

20. The wireless communication device of claim 18, wherein the second portion of said circuitry is a current-mode array.

* * * * *